United States Patent
Smith et al.

(10) Patent No.: US 6,232,905 B1
(45) Date of Patent: May 15, 2001

(54) CLOCKING TECHNIQUE FOR REDUCING SAMPLING NOISE IN AN ANALOG-TO-DIGITAL CONVERTER

(75) Inventors: Malcolm H. Smith, Macungie; Jiancheng Mo, Allentown, both of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/263,952

(22) Filed: Mar. 8, 1999

(51) Int. Cl.[7] .................................................. H03M 1/12
(52) U.S. Cl. ........................................... 341/155; 341/118
(58) Field of Search ..................................... 341/155, 118, 341/115, 126; 358/149

(56) References Cited

U.S. PATENT DOCUMENTS

| | | | |
|---|---|---|---|
| 4,602,243 | * 7/1986 | Von Bargen et al. | 341/155 |
| 4,611,196 | 9/1986 | Fernandez | 341/155 |
| 4,791,486 | 12/1988 | Fukazawa et al. | 358/149 |
| 4,791,488 | * 12/1988 | Fukazawa et al. | 348/537 |
| 5,005,016 | 4/1991 | Schmidt et al. | 341/142 |
| 5,025,328 | * 6/1991 | Silva | 341/155 |
| 5,539,473 | 7/1996 | Kommrusch et al. | 348/537 |

* cited by examiner

Primary Examiner—Howard L. Williams
Assistant Examiner—Jean Bruner Jeanglaude
(74) Attorney, Agent, or Firm—Dickstein Shapiro Morin & Oshinsky LLP

(57) ABSTRACT

A method and apparatus are disclosed for improving the operation of an analog-to-digital converter ("ADC"). A separate "clean" oscillator clock is to be used in combination with a "noisy" ADC clock being regulated by a phase-locked-loop (PLL) circuit. The "noisy" ADC clock drives the digital control logic and also turns on the sample signal for the purpose of sampling. The second clock, which has a substantially fixed (i.e., "clean") frequency is used to generate a short pulse, the leading edge of which turns off the sample signal, thereby providing an improved sampling process with greater resolution. The interaction of the two clocks is controlled with digital logic circuitry.

72 Claims, 4 Drawing Sheets

CLOCKING TECHNIQUE FOR REDUCING SAMPLING NOISE IN AN ANALOG-TO-DIGITAL CONVERTER

BACKGROUND OF THE INVENTION

1. Field of the Invention

The present invention relates to improving the operation of analog-to-digital converters ("ADCs"). More specifically, it relates to the removal of clock noise from the sampling process, thereby improving the resolution of the ADC.

2. Description of the Related Art

When digital processing hardware receives an analog signal, it first digitizes the analog signal with an analog-to-digital converter (ADC). After the signal has been digitized, it may be forwarded to downstream digital processing circuitry for further analysis and/or manipulation. Not surprisingly, in many applications, it is desirable to use an inexpensive ADC which produces high resolution digital samples at a relatively high rate.

Currently, several different types of ADCs are used in the art. This nonexclusive list includes successive approximation ADCs, dual slope integrating ADCs, and charge balancing ADCs.

Successive approximation ADCs provide a fast analog-to-digital conversion of a momentary value of the analog input signal. Generally, they work by first comparing the sampled input voltage with a voltage that is one-half the input range. If the sampled input voltage is greater, the ADC then compares the sampled input signal with three-quarters of the input range, and so on. For example, twelve such steps provides twelve-bit resolution. While these successive comparisons are taking place, the signal is frozen in a sample and hold circuit. After conversion, the resulting bytes are typically placed into either a pipeline or buffer store.

Dual slope integrating ADCs operate a bit differently. Integrating ADCs let the analog input signal charge a capacitor for a fixed period of time. The converter then measures the time required for the capacitor to fully discharge at a fixed rate. This time is a measure of the integrated input voltage.

Charge balancing ADCs simultaneously charge and discharge a capacitor. That is, a capacitor is charged with an input analog signal for a fixed period of time only to then be discharged in discrete units called charge packets. If the capacitor is charged to more than the packet size it will release a packet (i.e., through discharging). On the contrary, if the capacitor is not charged to more than the packet size, a packet will not be released. This systematic and simultaneous charging and discharging of the capacitor, which results in the release of charge packets, produces a pulse train. The input voltage is determined, and, hence, the digital signal is formed, by counting the packets released by the capacitor (i.e., the pulse train).

FIG. 1 depicts a block diagram of a successive approximation ADC similar to that currently being used on the Lucent Technologies, Inc. "1615/POMP15" digital signal processor chip. A sample and hold circuit 23 is coupled to a non-overlap generator 22. The non-overlap generator 22 is, in turn, coupled to one stage of a rotating ones counter 10; each stage of the counter 10 receiving clock pulses from the ADC clock ADCCLK.

An analog input signal 60 is fed into the sample and hold circuit 23. The sample and hold circuit 23, as is well known in the art, actually performs the reading and recording of the sampled analog signal. That is, the circuit 23 includes a capacitor which records the amplitude level of the sampled signal as a charging voltage level, during the period when the SAMPLE signal is enabled. Thereafter, the SAMPLE signal is disabled and the HOLD circuit is enabled, wherein the actual evaluation of the analog signal takes place, much like that described above for successive approximation ADCs.

The non-overlap generator 22 acts as a task manager, ensuring that the sampling function and the holding function, of the sample and hold circuit 23, do not overlap. Thereafter, the voltage sample 59 is input to an analog-to-digital x-bit counter 56 for digitizing, where x designates the degree of resolution (e.g., 12-bit). The digitized signal is then typically stored or buffered in a parallel latch 57 until it is needed.

The resulting x-bit digital word 48 contains a weighting hierarchy, wherein $d_0$ is called the least significant bit because it represents the smallest weighting and $d_{x-1}$ is called the most significant bit since it represents the largest weighting.

Also depicted in FIG. 1 is the PLL circuit 14 from which the ADC clock ADCCLK is ordinarily derived. A voltage controlled oscillator ("VCO") 15, running at a very high frequency VCOCLK is divided down by a factor of J within divider circuitry 16, forming the ADC clock ADCCLK. The ADC clock is then forwarded to the rotating ones counter 10 for controlling the enabling of the SAMPLE signal, via the output of one stage of the counter 10, and for controlling the successive approximation algorithm.

The frequency of the ADC clock ADCCLK is maintained relatively constant by the PLL circuit 14, wherein the ADC clock ADCCLK (which is also the VCO clock/J) is further divided down by a factor of K, forming the reference clock 27. The reference clock 27 (i.e., also equal to the VCO clock/(J)(K)) is then fed into a phase detector circuit 13 for comparison to a lower frequency oscillator clock KOSC, where the reference clock 27 is desired to be equal to KOSC. After detecting the phase difference (if any) between the oscillator clock KOSC and the reference clock 27, the phase detector sends a voltage control signal 25 through a loop filter 14. After having been filtered, the filtered voltage control signal 26 is sent to the VCO 15, providing an increased, or decreased voltage, whereby the clock frequency of the VCO 15 is adjusted either up or down, or not at all. The desired result is for the VCOCLK to be maintained at a frequency level equal to KOSC×J×K.

The PLL attempts to maintain the ADC clock ADCCLK at a frequency equal to the low frequency oscillator clock frequency KOSC multiplied by a factor K, where the ADC clock ADCCLK is sufficiently faster than the low frequency KOSC to enable the ADC to efficiently carry out the successive approximation process.

Notwithstanding the efforts of the PLL circuit 14 to so regulate the ADC clock ADCCLK, noise invariably enters the system and adversely affects the regularity of the ADC clock's clock frequency ADCCLK.

One specific example of an element of noise which can easily be introduced into the PLL circuit 14 is that of thermal noise. Thermal noise is defined as kTRB, where k is Boltzmann's constant, T is the temperature, R is the circuit impedance, and B is the oscillation bandwidth; the only variable being the temperature (T). Hence, thermal noise, and its concomitant effects, increase proportionally with the temperature.

Another source of clock noise is due to the fact that ordinarily, the PLL circuit 14 is designed to operate on as low a power level as possible (e.g., the "1615/POMP15" is driven by a 38.4kHz clock which is multiplied up to several tens of MHz), thus requiring very high internal impedance values at various nodes throughout the PLL circuit 14. As is well known in the art, the higher the internal impedance of the PLL circuit 14, the more susceptible it is to noise. The susceptibility phenomenon is exacerbated in those instances in which the PLL circuit 14 is not securely tied to ground, as in a floating configuration.

One specific manifestation of noise being introduced within the PLL circuit 14 is clock pulse "jitter." Jitter, as it in known in the art, relates to the non-fixed frequency of the clock pulse used to drive the sampling and conversion processes; in this case, the ADC clock ADCCLK If the frequency of the ADC clock ADCCLK is not precisely fixed, it may cause serious operational problems for the ADC, reducing accuracy and resolution.

More specifically, when the ADC clock ADCCLK frequency is not fixed during the sampling process, the portion of the signal being sampled varies with the frequency, thus resulting in a tainted evaluation of the analog signal. That is, during the sampling process, a first clock pulse from the noisy ADC clock ADCCLK instructs the ADC to begin sampling the analog signal. The ADC will continue sampling the analog signal until it receives a pre-determined number of additional clock pulses from the noisy ADC clock ADCCLK In as much as it is the exact point in time when the sampling is stopped that determines which portion of the analog signal has been sampled, the accuracy and precise timeliness of the arrival of that "disabling" clock pulse ADCCLK directly affects the accuracy of the ADC and the resolution of the digitized signal.

Still referring to FIG. 1, a rotating ones counter 10 configured with successively coupled D flip-flops FF1, FF2, ... FFn, such as in use within the digital control logic of a successive approximation ADC, is shown. As is well known in the art, counters (such as the rotating ones counter 10) are found in almost all equipment containing digital logic. They are used for counting the number of occurrences of an event and for generating timing sequences to control various digital operations, such as the enabling and disabling of a SAMPLE signal.

As it is used in FIG. 1, the counter 10 performs two primary functions within the ADC that are most relevant to the present invention: i) initiating the sampling process by enabling the SAMPLE signal upon a first clock pulse, and ii) ending the sampling process by disabling the SAMPLE signal upon sending a second clock pulse some time after the first clock pulse.

In as much as the rotating ones counter 10 is driven by the noisy ADC clock ADCCLK, the ADC clock ADCCLK jitter has an effect upon the timing of the counter 10 that is perpetuated throughout the ADC system. Specifically, of the counter's 10 two most relevant functions, the one function affected most adversely is that of disabling the sampling signal SAMPLE since, as previously mentioned, it is the instant at which sampling stops that determines the portion of the analog signal that has been sampled.

Furthermore, in as much as the counter 10 controls the analog-to-digital conversion process, any jitter present within the ADC clock pulse ADCCLK will result in the jitter actually modulating the analog signal that is being held on the capacitor within the sample and hold circuitry. This modulation worsens as the sampling frequency increases, thus adding to the adverse affects of the sampling noise.

SUMMARY OF THE INVENTION

The present invention provides a method and apparatus for utilizing the low frequency oscillator clock KOSC (i.e., the clean clock), rather than the noisy ADC clock ADCCLK (of FIG. 1) for the purpose of disabling the SAMPLE signal, thereby resulting in a much more accurate and consistent sampling process due to the fixed clock frequency of the oscillator clock KOSC.

In the preferred embodiment, an RS latch is set with the output signal from one stage of the rotating ones counter 10. Setting the RS latch turns on (or enables) the sample signal. The setting of the RS latch is effectively driven by the noisy ADC clock ADCCLK since the ADC clock is driving the rotating ones counter.

The SAMPLE signal is turned off (or disabled) by a clock pulse driven by the oscillator clock KOSC. This is achieved by resetting the RS latch with a "clean" clock pulse supplied by the oscillator clock KOSC. The oscillator clock KOSC, having a fixed and known frequency, drives a short pulse, the rising edge of which defines the moment when the RS latch is reset, thereby turning off the sample signal.

The short pulse is produced with a separate pulse generator circuit which is coupled to the reset input of the RS latch. The cessation of the SAMPLE signal in this way provides for greatly improved ADC resolution. Furthermore, the accuracy of the signal being held by the capacitor is not compromised by the modulation of clock noise onto the sampled signal.

Any low power device in which there is a PLL produced clock, having been regulated with reference to a low frequency clock, will benefit from the present invention.

An added advantage of the present invention is the low cost and ease with which it may be implemented within existing ADC control logic. That is, with the mere addition of an RS latch and supporting digital logic circuitry, improved resolution may be achieved at low cost and with, essentially, the same ADC.

BRIEF DESCRIPTION OF THE DRAWINGS

These and other advantages and features of the invention will be more clearly understood from the following detailed description of the invention which is provided in connection with the accompanying drawings in which.

DETAILED DESCRIPTION OF PREFERRED EMBODIMENT

A preferred embodiment of the present invention will now be described with reference to FIGS. 2–4. Other embodiments may be realized and structural, or logical changes may be made to the disclosed embodiment without departing from the spirit or scope of the present invention.

Figure 2:
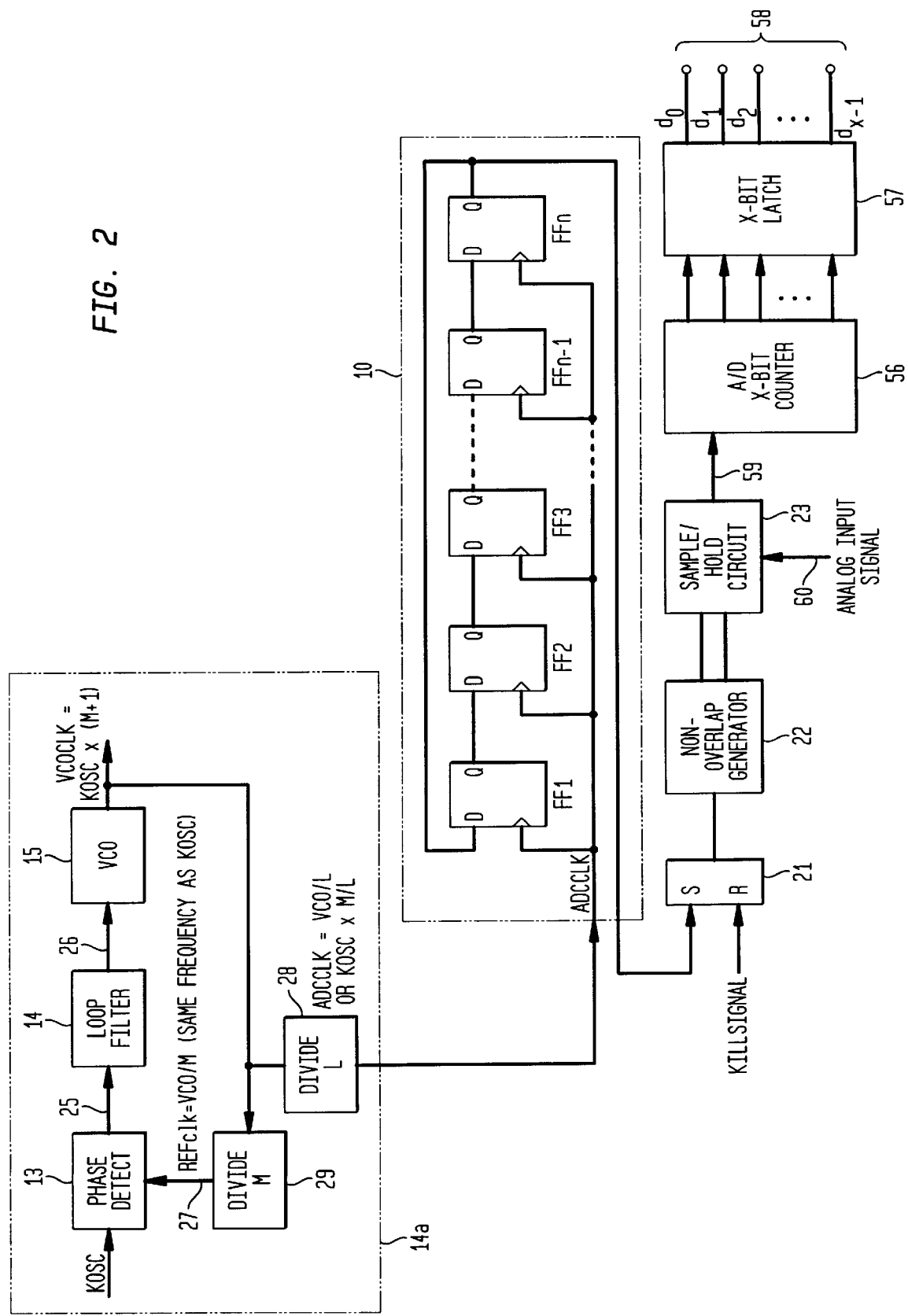
FIG. 2 illustrates an embodiment of the invention in which an RS latch is coupled between the FIG. 1 ones counter and the sample and hold circuit.

FIG. 2 depicts a conventional rotating ones counter 10, of n stages, consisting of n successive D flip-flops FF1, FF2, ... FFn, where n may be any number that allows the ADC to satisfactorily perform the particular conversion process being employed. The output of each D flip-flop Q is coupled to the input of the D flip-flop immediately following. The output of the $n^{th}$ D flip-flop Q is coupled to the input of the first D flip-flop D. The clock input of each D flip-flop FF1, FF2, . . . FFn is coupled to the noisy ADC clock ADCCLK Therefore each of the n D flip-flops receives the same common clock pulse ADCCLK.

Figure 1:
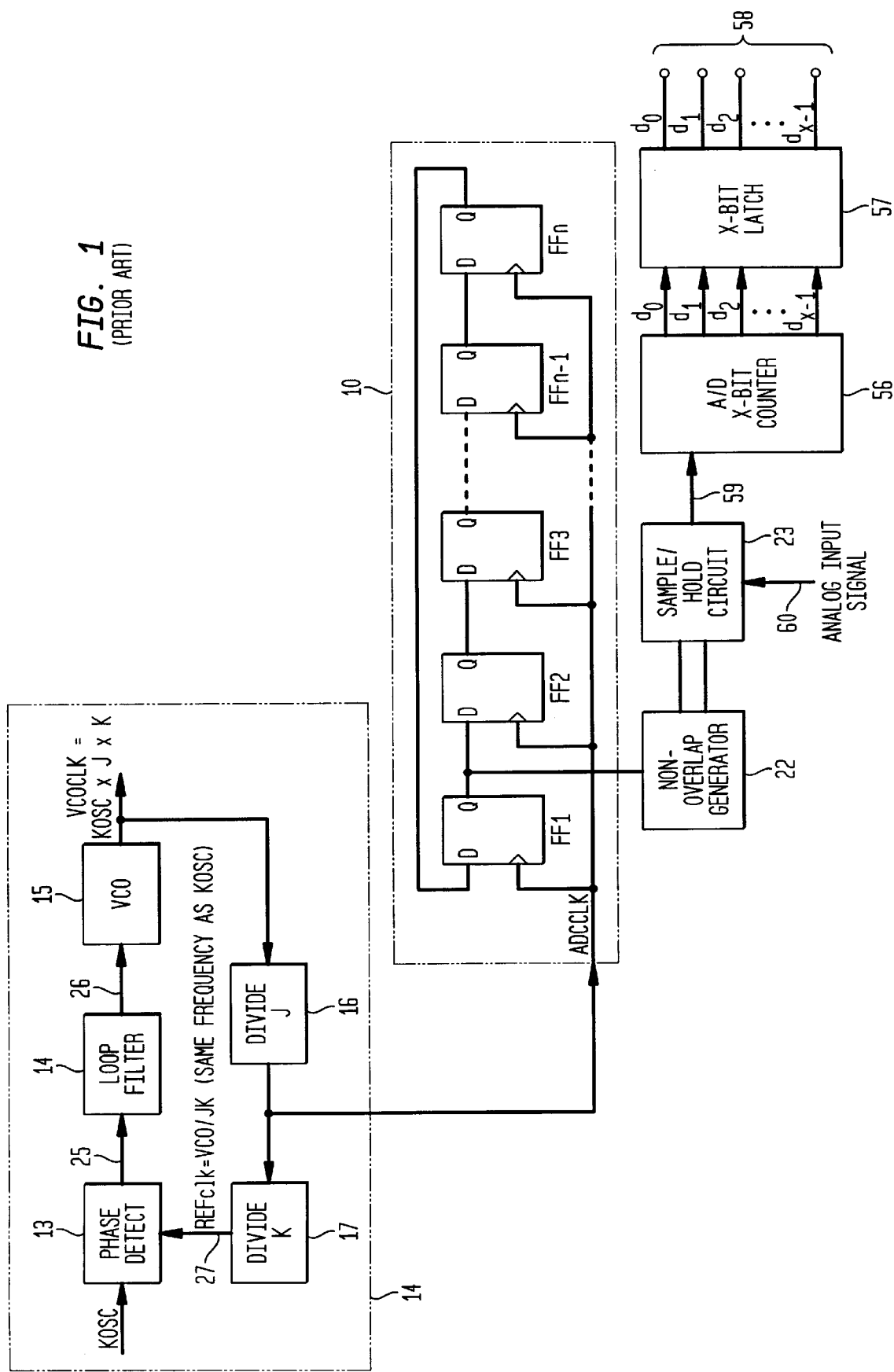
FIG. 1 illustrates a conventional configuration of a ones counter coupled to a sample and hold circuit which form part of an analog-to-digital converter circuit.

The ADC clock ADCCLK is generated by the PLL circuit 14a, wherein the ADC clock is maintained at a frequency equal to M/L times the low frequency oscillator clock KOSC, where M/L is equal to at least thirteen. That is, the operation of the FIG. 2 PLL circuit 14a is identical to that of FIG. 1 (i.e., 14), with the exception that in the FIG. 2 PLL circuit 14a, the ADC clock is maintained at a frequency of at least thirteen times that of the oscillator clock KOSC.

The reason for the M/L factor is that in the case of an ADC using a successive approximation conversion process, e.g., using twelve bit resolution, a total of at least thirteen consecutive D flip-flops (i.e., number of bits of resolution +1) will be required in the rotating ones counter 10. Therefore, in accordance with the present invention, in which the oscillator clock KOSC (running at a slower "sampling" frequency, as compared with the faster ADC clock ADCCLK which controls the successive approximation process) drives the rising edge of the KILLSIGNAL, the ADC clock ADCCLK must be at least thirteen times the frequency of the oscillator clock KOSC, so as to complete the conversion before the next rising edge of KILLSIGNAL is driven by the oscillator clock KOSC.

The output of one stage of the rotating ones counter is coupled to the set input S of an RS latch 21. While FIG. 2 depicts the output of the $n^{th}$ stage as being coupled to the set input S of the RS latch 21, it should be readily apparent that any stage of the rotating ones counter may serve to set the RS latch 21 so long as that stage is not being used to generate internal signals during the conversion process.

Upon being set, the RS latch 21 causes generation of the SAMPLE signal, thereby beginning the sampling process, wherein the sample and hold circuit 23 is receiving an analog signal 60. The sampling process continues until the RS latch 21 receives the rising edge of a short pulse KILLSIGNAL from a pulse generator (of FIG. 3) on its reset input line R. Upon the RS latch 21 being reset, the SAMPLE signal is disabled and the HOLD signal is enabled, thereby beginning the analog-to-digital conversion process. The non-overlap generator 22 ensures that there is no overlap between the enablement of the SAMPLE signal and the enablement of the HOLD signal. The actual analog-to-digital conversion occurs in a manner which is identical to that described for FIG. 1.

After the successive approximation algorithm is complete, the one flip-flop within the ones counter 10 that is coupled to the RS latch 21 will output a high signal, thereby setting the RS latch 21. This has the effect of enabling the SAMPLE signal, whereby the sample and hold circuit 23 automatically reverts back to sampling the analog signal some time after the ADC has completed its conversion process. The sample and hold circuit 23 will continue sampling the analog signal until the RS latch 21 is reset by the next rising edge of the short pulse KILLSIGNAL, at which point the next sample will have been recorded.

While FIG. 2 depicts a rotating ones counter 10, it should be readily apparent that other counters may be used in its place without departing from the scope of the present invention. Additionally, the use of D flip-flops for the counter is not an exclusive requirement. That is, other flip-flops may be used in place of D flip-flops including, but not limited to, JK flip-flops, and transparent latches.

As described above, the resetting of the RS latch 21, in FIG. 2, occurs upon the receipt of the rising edge of the short pulse KILLSIGNAL, however, it should be readily apparent that the system may be configured in such a way as to make the receipt of the falling edge, or a portion thereof, of the KILLSIGNAL pulse the resetting event. In addition, it should be noted that any other clocked sequential circuit may be used in lieu of the RS latch 21, so long as it performs in an equivalent manner as that described above. Accordingly, such a substitution would not depart from the scope of the present invention.

Figure 3:
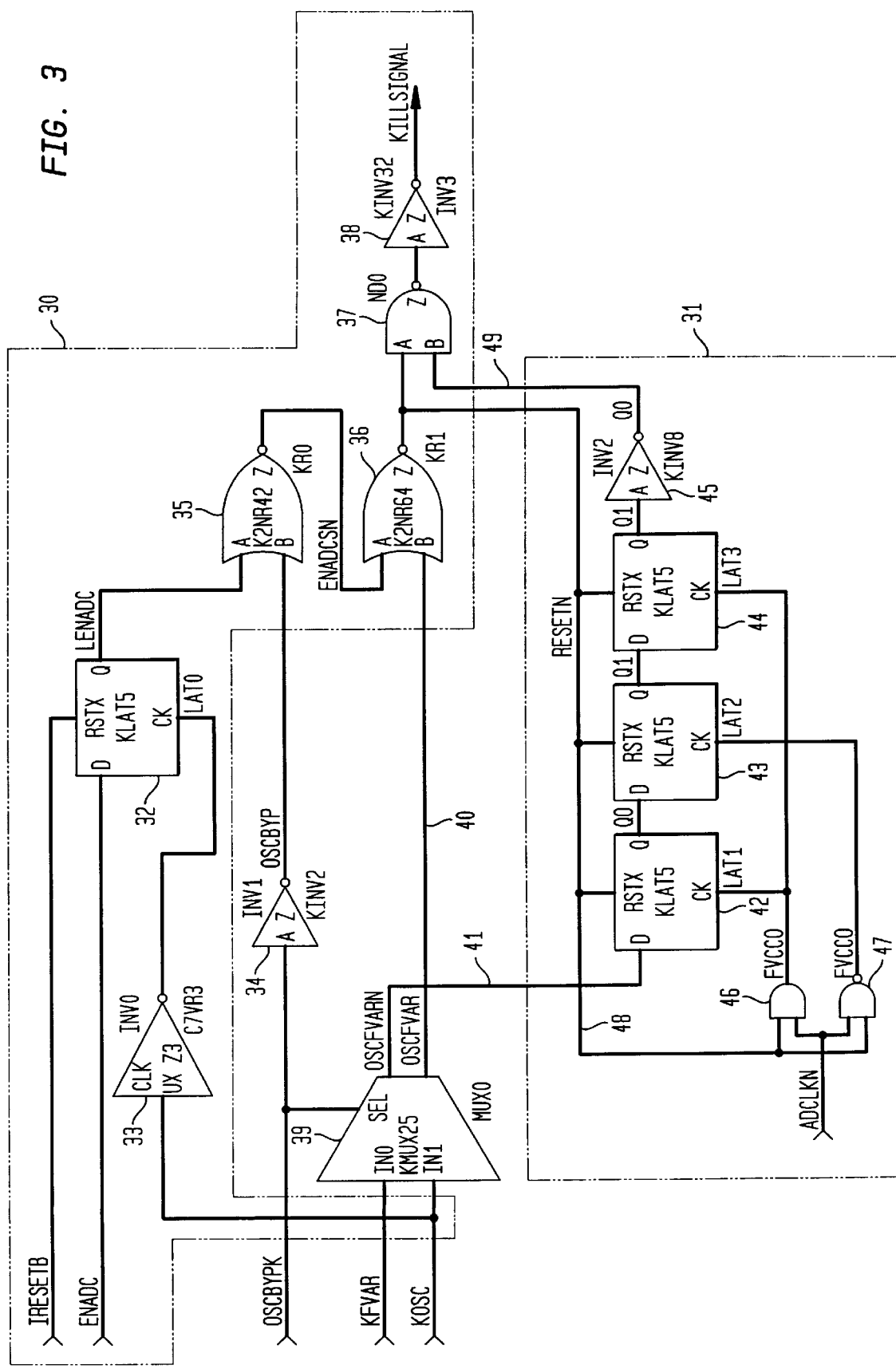
FIG. 3 illustrates a pulse generator circuit used to reset the RS latch.

FIG. 3 depicts the pulse generator circuit used to produce the short pulse KILISIGNAL (of FIG. 2). As described more fully below, circuit segment 30, of the FIG. 3 pulse generator circuit, ensures the rising edge of the short pulse KILLSIGNAL is generated by the clean oscillator clock KOSC.

At the heart of circuit segment 30 is a D flip-flop 32. The D flip-flop 32 has a D input, a clock pulse input CK, and a reset input RSTX. Since it is an object of the present invention to enable the FIG. 3 pulse generator circuit only when the ADC is enabled, the enable ADC signal ENADC (i.e., as denoted on the Lucent Technologies, Inc. "POMP19" DSP chip), is coupled to the D input of D flip-flop 32. Furthermore, to ensure the pulse generator does not provide a spurious pulse when the ADC is enabled, the oscillator clock KOSC is coupled to the clock input CK of the D flip-flop 32 after it has been driven through inverter 33.

The above described configuration serves a dual purpose: i) to ensure the pulse generator circuit will not generate a pulse unless the ADC is enabled, and ii) to ensure that the short pulse KILLSIGNAL will not be generated until at least one-half of an oscillator clock phase (of KOSC) has passed from the time the ADC becomes enabled.

The output of the D flip-flop 32 is coupled to one input line of a NOR gate 35. The other input line of NOR gate 35 is coupled to an inverted oscillator clock bypass signal OSCBYPK. That is, the user has an option of bypassing the oscillator clock KOSC, in favor of a divided down high frequency external clock KFVAR (i.e., as it is denoted on the Lucent Technologies, Inc. "POMP19" DSP chip) for the purpose of driving the rising edge of KILLSIGNAL. When the user so selects, the OSCBYPK signal is set high. The high OSCBYPK signal is then sent through inverter 34, thereby resetting the OSCBYPK low, the low OSCBYPK signal being the other input to NOR gate 35.

Still referring to circuit segment 30, of FIG. 3, when the oscillator clock KOSC is bypassed, as previously described, the OSCBYPK signal is set high. The OSCBYPK signal is also coupled to the selection input SEL of multiplexer ("MUX") 39. MUX 39 will conduct either the oscillator clock KOSC or the external clock KFVAR, depending upon whether the bypass signal OSCBYPK is set low or high, respectively. Whichever clock is selected, KOSC or KFVAR, it passes through MUX 39 as signal 40 where it is denoted as OSCFVAR. The selected clock source OSCFVAR is then fed into one input of a NOR gate 36. The other input of NOR gate 36 is supplied by the output signal of NOR gate 35. The output of NOR gate 36 is then fed through to one input of AND gate 37. The output of NOR gate 36 is also fed to a reset input RSTX of three D flip-flops 42, 43, 44, and also fed to a respective input of AND gate 46 and NAND gate 47.

The rising edge of KILLSIGNAL is generated by circuit segment 30 at this point. That is, both inputs of NAND gate 37 being set high, its output is set low. After passing through inverter 38, the KILLSIGNAL is passed on to the RS latch 21 (of FIG. 2).

Turning now to circuit segment 31, of FIG. 3, is accordance with the present invention, the only consideration for the negative (falling) edge of the short pulse KILLSIGNAL (i.e., since only the rising edge is important for disabling the SAMPLE signal) is that it must occur before the SAMPLE signal (of FIG. 2) is enabled again by the ADC. That is, the falling edge of KILLSIGNAL must occur before the successive approximation process has been completed. This is achieved through circuit segment 31, as described more fully below.

An inverted version of the ADC clock ADCLKN is used to generate the negative edge by using it to delay an inverted version of the low frequency clock used to start the pulse 41 (i.e., either the oscillator clock KOSC, or the divided down external clock KFVAR). ADCLKN is fed into one input of AND gate 46 and also fed into one input of NAND gate 47. The other input to each of these gates 46,47 is fed from the output of NOR gate 36, as described above with respect to circuit segment 30.

AND gate 46 is coupled to a clock input CK of both flip-flop 42 and 44. NAND gate 47 is coupled to a clock input of CK of flip-flop 43, thereby effectuating the delay of signal 41 from forming the falling edge of KILLSIGNAL.

Whichever clock is selected by the MUX 39, KOSC or KFVAR, an inverted version of the selected clock is fed into the D input of D flip-flop 42. As the signal 41 is successively passing through D flip-flop 42, D flip-flop 43, and D flip-flop 44, at the ADCLKN frequency, the ADC will be performing its successive approximation process, being driven by the opposite phase of the ADCLKN clock (i.e., ADCCLK). As soon as the output of D flip-flop 44 is set high, inverter 45 will reset it low and feed the low signal 49 into one input of NAND gate 37, thereby producing the falling edge of KILLSIGNAL.

The circuit segment 31 configuration ensures that the RS latch 21 (of FIG. 2) will receive KILLSIGNAL for a long enough period of time (approximately three ADCLKN clock pulses) to properly reset, before KILLSIGNAL's falling edge occurs. Furthermore, since the successive approximation process takes at least thirteen pulses (i.e., number of bits of resolution+1) of the ADC clock ADCCLK to fully evaluate the sampled analog signal, and the falling edge of KILLSIGNAL will occur in approximately three clock pulses of ADCCLK's opposite phase (ADCLKN), due to the delay introduced by D flip-flops 42, 43, and 44, KILLSIGNAL will have always been reset low by the time the successive approximation process is complete.

Figure 4:
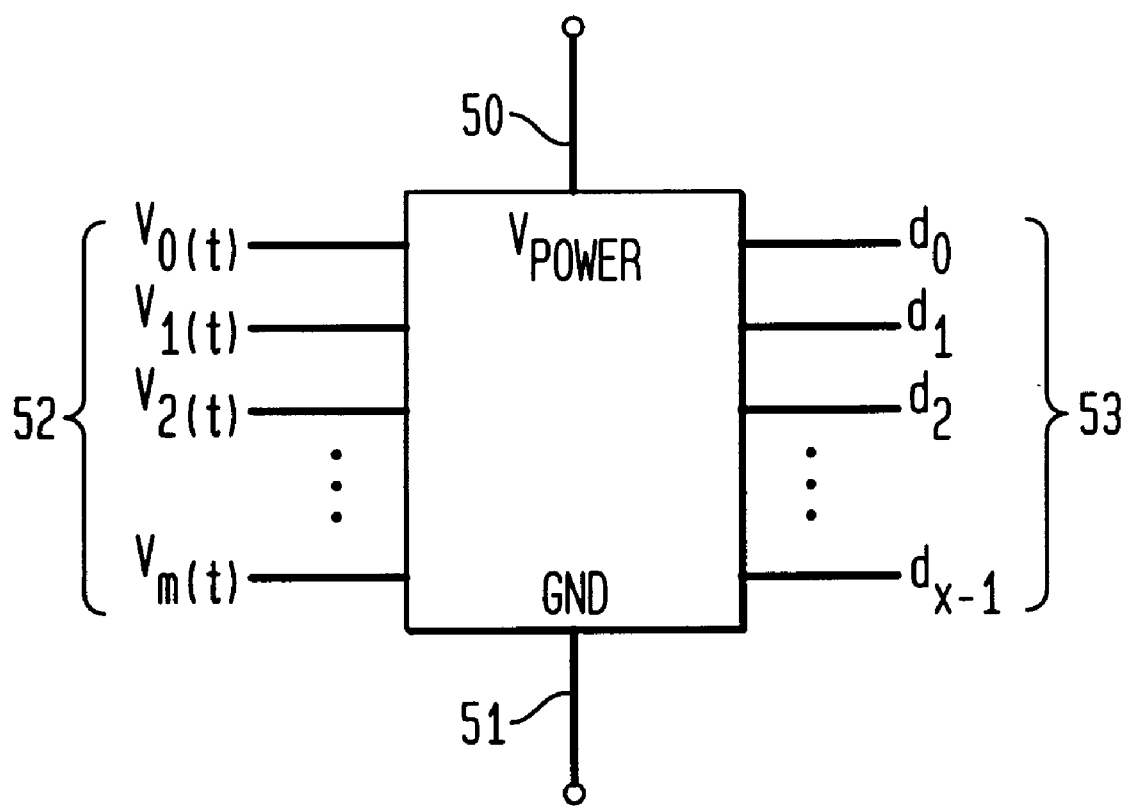
FIG. 4 illustrates an integrated circuit which incorporates the invention.

Turning now to FIG. 4, a block diagram of a integrated circuit ("IC") is depicted. The IC is similar to one into which the sampling noise reduction circuit (of FIGS. 2 and 3) may be incorporated. The IC contains a power input terminal 50 which ordinarily receives a supply voltage of between 3 volts and 15 volts, depending upon the specific semiconductor being used within the IC. Also included on the IC block diagram is a ground connection 51.

The left side of the IC block diagram illustrates an analog input 52. The analog input 52 consists of m discrete analog signals as a function of time $V_0(t)$, $V_1(t)$, $V_2(t)$ . . . $Vm(t)$, of which m may be any number greater than zero. Each of the m analog inputs 52 require digital conversion by the IC. The IC performs the analog-to-digital ("A/D") conversion using a circuit identical to that depicted in FIGS. 2 and 3. The IC then delivers the digitized output signal 53 with x-bit resolution, where x may be any number; x being illustrated as twelve.

It should be readily apparent that the FIG. 4 IC may be further incorporated into many different processor-based architectures for the purpose of providing A/D conversion.

While a successive approximation ADC algorithm has been discussed in connection with the preferred embodiment of the invention, the present invention may be used in any ADC architecture in which there is a sampling phase followed by a conversion phase that is carried out in several stages; the stages being driven from a higher frequency clock than the sampling clock. Such other specific architectures that would benefit from the invention include, but are not limited to, iterative algorithmic (not pipelined), subranging (two-step), and integrating converters, all of which are well known in the art.

Furthermore, while a preferred embodiment of the schematic diagram for the pulse generator circuit has been described, it should be readily apparent that any configuration and/or combination of hardware may be used to perform the same, or similar operations as those performed by circuit segments 30 and 31, as described above. For instance, instead of three D flip-flops 42, 43, 44, a different number of flip-flops may be employed as long as the operation of the circuit ensures the delay of the falling edge of the KILLSIGNAL long enough for the RS latch to properly reset, and for a period of time which is shorter than that required to complete the conversion process.

Additionally, while the preferred embodiment uses the opposite phase of the noisy ADC clock ADCLKN to delay the introduction of the falling edge pulse, both the pulse itself, and the method with which it is introduced may be altered without departing from the scope of the present invention. Finally, the above described circuit, comprising the coupling of both FIGS. 2 and 3, or a portion thereof, to form the apparatus and clocking method for reducing sampling noise of the invention, may be incorporated onto a single integrated circuit, or a series of such chips, for use in any device which performs digital conversion of analog signals.

Therefore, while a preferred embodiment of the invention has been described and illustrated, it should be apparent that many modifications can be made to the invention without departing from its spirit or scope. Accordingly, the invention is not limited by the foregoing description or drawings, but is only limited by the scope of the appended claims.

What is claimed as new and desired to be protected by Letters Patent of the United States is:

1. An apparatus for use with an analog-to-digital converter (ADC), the apparatus comprising:
   at least one logic signal passing device, said device comprising a plurality of output control inputs and at least one output;
   a first signal source for producing at least a first input signal driven by a first clock source, said first signal source being coupled to at least a first one of said plurality of inputs of said logic signal passing device, said at least a first input signal enabling said ADC to begin a sampling process; and
   a second signal source for producing at least a first portion of a second input signal driven by a second clock source, said second signal source being coupled to at least a second one of said plurality of inputs of said logic signal passing device, said at least a first portion of said second input signal disabling said ADC's ability to sample.

2. The apparatus as in claim 1, wherein one of said first, said second and a third signal source produces at least a second portion of said second input signal, one of said first, said second, and said third signal source being coupled to said at least a second one of said plurality of inputs of said logic signal passing device, one of said first, said second, and said third signal source also driving said second portion of said second input signal by one of said first, said second, and a third clock source.

3. The apparatus as in claim 1 further comprising:
   a non-overlap generator, an input of said generator being coupled to said at least one output of said at least one logic signal passing device; and
   a sample and hold circuit, an input of said sample and hold circuit being coupled to an output of said non-overlap generator.

4. The apparatus as in claim 1, wherein said at least one logic signal passing device further comprises a flip-flop.

5. The apparatus as in claim 4, wherein said flip-flop further comprises an RS latch.

6. The apparatus as in claim 5, wherein said at least a first input further comprises a set input of said RS latch.

7. The apparatus as in claim 1, wherein said first source further comprises at least one stage of a logic counter.

8. The apparatus as in claim 7, wherein a clock input of each stage of said logic counter is coupled to said first clock source.

9. The apparatus as in claim 8, wherein said logic counter further comprises a rotating ones counter.

10. The apparatus as in claim 9, wherein said rotating ones counter further comprises a plurality of cascade connected D type flip-flops.

11. The apparatus as in claim 1, wherein said first clock source is of a greater frequency than said second clock source.

12. The apparatus as in claim 11, wherein a frequency of said first clock source is at least n+1 times greater than a frequency of said second clock source, where n is a number of bits of resolution.

13. The apparatus as in claim 1, wherein said first clock source is regulated with a phase locked loop circuit (PLL).

14. The apparatus as in claim 13, wherein said first clock source is a divided down version of a voltage controlled oscillator.

15. The apparatus as in claim 13, wherein a reference clock of said PLL is a divided down version of a voltage controlled oscillator.

16. The apparatus as in claim 15, wherein said reference clock is a divided down version of said first clock source.

17. The apparatus as in claim 1, wherein said first clock source further comprises a divided down version of a high frequency external clock.

18. The apparatus as in claim 1, wherein said second signal source produces a rising edge of said second input signal.

19. The apparatus as in claim 2, wherein one of said first, said second, and said third signal source produces a falling edge of said second input signal.

20. The apparatus as in claim 2, wherein said second signal source further comprises a logic circuit, said logic circuit further comprising:
   a plurality of clock sources;
   a pulse generator circuit for driving said at least a first portion of said second input signal, said pulse generator circuit being coupled to at least one of said plurality of clock sources; and
   a delay circuit for driving said at least a second portion of said second input signal, said delay circuit being coupled to at least one of said plurality of clock sources, and said delay circuit also being coupled to said pulse generator circuit.

21. The apparatus as in claim 20, wherein said plurality of clock sources further comprise:
   an oscillator clock; and
   a divided down version of a voltage controlled oscillator clock.

22. The apparatus as in claim 21 further comprising a divided down version of an external high frequency clock.

23. The apparatus as in claim 20 further comprising at least one multiplexer (MUX), said MUX further comprising at least two inputs and at least one output, said at least two inputs being respectively coupled to at least a first two of said plurality of clock sources, said at least one output being coupled to said pulse generator circuit.

24. The apparatus as in claim 20, wherein said delay circuit further comprises at least one flip-flop, said at least one flip-flop serving to delay an occurrence of said second portion of said second input signal.

25. The apparatus as in claim 20, wherein said pulse generator circuit further comprises:
   a first inverter, an output of said first inverter being coupled to said at least a second input of said at least one logic signal passing device;
   a NAND gate, an output of which is coupled to an input of said first inverter, a first input of which is coupled to said delay circuit segment;
   a first NOR gate, an output of which is coupled to a second input of said NAND gate, a first input of which is coupled to an output of said MUX;
   a second NOR gate, an output of which is coupled to a second input of said first NOR gate;
   at least one D flip-flop, an output of which is coupled to an input of said second NOR gate, an input of which is coupled to an ADC enable signal, a clock input of said at least one D flip-flop being coupled to a second inverter, and wherein
   an input of said second inverter is coupled to an oscillator clock; and
   a third inverter, an output of which is coupled to an input of said second NOR gate, an input of which is coupled to an oscillator clock bypass signal.

26. The apparatus as in claim 20, wherein said delay circuit further comprises:
   a first inverter, an output of said first inverter being coupled to a first input of a first NAND gate, an input of said first inverter being coupled to an output of a first flip-flop;
   an AND gate, an output of which is coupled to a clock input of at least said first flip-flop, an input of which is coupled to a reset input of at least said first flip-flop; and
   a NAND gate, an output of which is coupled to a clock input of at least a second flip-flop, an input of which is coupled to an input of said AND gate.

27. An integrated circuit (IC) comprising:
   an analog to digital converter (ADC) including a sample and hold circuit; and
   an apparatus for use with said analog-to-digital converter, said apparatus further comprising:
      at least one logic signal passing device, said device comprising a plurality of output control inputs and at least one output;
      a first signal source for producing at least a first input signal driven by a first clock source, said first signal source being coupled to at least a first one of said plurality of inputs of said logic signal passing device, said at least a first input signal enabling said ADC to begin a sampling process; and a second signal source for producing at least a first portion of a second input signal driven by a second clock source, said second signal source being coupled to at least a second one of said plurality of inputs of said logic signal passing device, said at least a first portion of said second input signal disabling said ADC's ability to sample.

28. The IC of claim 27, wherein one of said first, said second and a third signal source produces at least a second portion of said second input signal, one of said first, said second, and said third signal source being coupled to said at least a second one of said plurality of inputs of said logic signal passing device, one of said first, said second, and said third signal source also driving said second portion of said second input signal by one of said first, said second, and a third clock source.

29. The IC of claim 27, said apparatus further comprising:

a non-overlap generator, an input of said generator being coupled to said at least one output of said at least one logic signal passing device; and a sample and hold circuit, an input of said sample and hold circuit being coupled to an output of said non-overlap generator.

30. The IC of claim 27, wherein said at least one logic signal passing device further comprises a flip-flop.

31. The IC of claim 30, wherein said flip-flop further comprises an RS latch.

32. The IC of claim 31, wherein said at least a first input further comprises a set input of said RS latch.

33. The IC of claim 27, wherein said first source further comprises at least one stage of a logic counter.

34. The IC of claim 33, wherein a clock input of each stage of said logic counter is coupled to said first clock source.

35. The IC of claim 34, wherein said logic counter further comprises a rotating ones counter.

36. The IC of claim 35, wherein said rotating ones counter further comprises a plurality of cascade connected D type flip-flops.

37. The IC of claim 27, wherein said first clock source is of a greater frequency than said second clock source.

38. The IC of claim 37, wherein a frequency of said first clock source is at least n+1 times greater than a frequency of said second clock source, where n is a number of bits of resolution.

39. The IC of claim 27, wherein said first clock source is regulated with a phase locked loop circuit (PLL).

40. The IC of claim 39, wherein said first clock source is a divided down version of a voltage controlled oscillator.

41. The IC of claim 39, wherein a reference clock of said PLL is a divided down version a voltage controlled oscillator.

42. The IC of claim 41, wherein said reference clock is a divided down version of said first clock source.

43. The IC of claim 27, wherein said first clock source further comprises a divided down version of a high frequency external clock.

44. The IC of claim 27, wherein said second signal source is capable of producing a rising edge of said second input signal.

45. The IC of claim 28, wherein one of said first, said second, and said third signal source produces a falling edge of said second input signal.

46. The IC of claim 28, wherein said second signal source further comprises a logic circuit, said logic circuit further comprising:

a plurality of clock sources;

a pulse generator circuit for driving said at least a first portion of said second input signal, said pulse generator circuit being coupled to at least one of said plurality of clock sources; and a delay circuit for driving said at least a second portion of said second input signal, said delay circuit being coupled to at least one of said plurality of clock sources, and said delay circuit also being coupled to said pulse generator circuit.

47. The IC of claim 46, wherein said plurality of clock sources further comprise:

an oscillator clock; and a divided down version of a voltage controlled oscillator clock.

48. The IC of claim 47 further comprising a divided down version of an external high frequency clock.

49. The IC of claim 46 further comprising at least one multiplexer (MUX), said MUX further comprising at least two inputs and at least one output, said at least two inputs being respectively coupled to at least a first two of said plurality of clock sources, said at least one output being coupled to said pulse generator circuit.

50. The IC of claim 46, wherein said delay circuit further comprises at least one flip-flop, said at least one flip-flop serving to delay an occurrence of said second portion of said second input signal.

51. The IC of claim 46, wherein said pulse generation circuit further comprises:

a first inverter, an output of said first inverter being coupled to said at least a second input of said at least one logic signal passing device;

a NAND gate, an output of which is coupled to an input of said first inverter, a first input of which is coupled to said delay circuit segment;

a first NOR gate, an output of which is coupled to a second input of said NAND gate, a first input of which is coupled to an output of said MUX;

a second NOR gate, an output of which is coupled to a second input of said first NOR gate;

at least one D flip-flop, an output of which is coupled to an input of said second NOR gate, an input of which is coupled to an ADC enable signal, a clock input of said at least one D flip-flop being coupled to a second inverter, and wherein an input of said second inverter is coupled to an oscillator clock; and a third inverter, an output of which is coupled to an input of said second NOR gate, an input of which is coupled to an oscillator clock bypass signal.

52. The IC of claim 46, wherein said delay circuit segment further comprises:

a first inverter, an output of said first inverter being coupled to a first input of a first NAND gate, an input of said first inverter being coupled to an output of a first flip-flop;

an AND gate, an output of which is coupled to a clock input of at least said first flip-flop, an input of which is coupled to a reset input of at least said first flip-flop; and a NAND gate, an output of which is coupled to a clock input of at least a second flip-flop, an input of which is coupled to an input of said AND gate.

53. A method of improving performance of an analog-to-digital converter (ADC), the method comprising:

generating a first signal, said first signal being derived from a first source and said first signal being driven by a first clock source;

receiving said first signal at at least a first input of a logic signal passing device so as to cause a first condition of said logic signal passing device;

starting a sampling process as a result of said first condition;

generating at least a first portion of a second signal, said at least a first portion being derived from a second source and said at least a first portion of said second signal being driven by a second clock source;

receiving said at least a first portion of said second signal at at least a second input of said logic signal passing device so as to cause a second condition of said logic signal passing device; and ending said sampling process as a result of said second condition.

54. The method as in claim 53 further comprising:

starting an analog-to-digital (A/D) conversion process;

generating at least a second portion of said second signal, said at least a second portion being derived from one of either said first, said second, or a third source and said at least a second portion being driven by one of a plurality of clock sources; and receiving said at least a second portion of said second signal at said second input of said logic signal passing device.

55. The method as in claim 53, wherein said act of generating a first signal further comprises generating said first signal from at least one stage of a counter circuit.

56. The method as in claim 53, wherein said act of generating a first signal further comprises regulating said first clock source with a phase locked loop circuit.

57. The method as in claim 56, wherein said act of regulating further comprises dividing down a voltage controlled oscillator clock frequency.

58. The method as in claim 53, wherein said act of generating a first signal further comprises dividing down an external clock frequency.

59. The method as in claim 53, wherein said act of receiving said at least a first portion further comprises receiving a rising edge of said second signal.

60. The method as in claim 53, wherein said act of receiving said at least a first portion further comprises causing an RS latch to set.

61. The method as in claim 53, wherein said act of generating at least a first portion of a second signal further comprises selecting one of at least an oscillator clock source and an external clock source.

62. The method as in claim 53, wherein said act of generating at least a first portion of a second signal further comprises enabling said act of generating only if said ADC is enabled.

63. The method as in claim 53, wherein said act of receiving said at least a first portion of said second signal further comprises causing an RS latch to reset.

64. The method as in claim 54, wherein said act of starting an A/D conversion process further comprises starting a successive approximation process.

65. The method as in claim 54, wherein said act of starting an A/D conversion process further comprises starting an iterative algorithmic conversion process.

66. The method as in claim 54, wherein said act of starting an A/D conversion process further comprises starting a sub-ranging conversion process.

67. The method as in claim 54, wherein said act of starting an A/D conversion process further comprises starting an integrating conversion process.

68. The method as in claim 54, wherein said act of generating at least a second portion further comprises generating a falling edge of said second signal.

69. The method as in claim 54, wherein said act of generating at least a second portion further comprises delaying said second portion until said first condition has occurred.

70. The method as in claim 54, wherein said act of generating at least a second portion further comprises generating said second portion before said sampling process in completed.

71. The method as in claim 54, wherein said act of generating at least a second portion further comprises selecting one of at least an oscillator clock source, an external clock source, or a divided down version of a voltage controlled oscillator clock source to drive said at least a second portion of said second signal.

72. The method as in claim 54, wherein said act of receiving said at least a second portion of said second signal further comprises receiving said second portion at a reset input of an RS latch.

* * * * *